US012738715B2

(12) United States Patent
Xu et al.

(10) Patent No.: US 12,738,715 B2
(45) Date of Patent: Sep. 15, 2026

(54) SEMICONDUCTOR OPTICAL DEVICE WITH A BURIED HETEROSTRUCTURE (BH) HAVING REDUCED PARASITIC CAPACITANCE AND REDUCED INTER-DIFFUSION

(71) Applicant: Applied Optoelectronics, Inc., Sugar Land, TX (US)

(72) Inventors: Dapeng Xu, Houston, TX (US); Dion McIntosh-Dorsey, Stafford, TX (US); Huanlin Zhang, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 569 days.

(21) Appl. No.: 17/841,983

(22) Filed: Jun. 16, 2022

(65) Prior Publication Data

US 2023/0411931 A1 Dec. 21, 2023

(51) Int. Cl.
*H01S 5/227* (2006.01)
*H01S 5/22* (2006.01)
*H01S 5/12* (2021.01)
*H01S 5/34* (2006.01)

(52) U.S. Cl.
CPC ............ *H01S 5/227* (2013.01); *H01S 5/2205* (2013.01); *H01S 5/12* (2013.01); *H01S 5/34* (2013.01)

(58) Field of Classification Search
CPC .......... H01S 5/227–2277; H01S 5/2205–2226; H01S 5/34306
See application file for complete search history.

(56) References Cited

U.S. PATENT DOCUMENTS 5,561,681 A * 10/1996 Nishimura .............. H01S 5/227 372/45.01
6,437,372 B1 * 8/2002 Geva ....................... H01S 5/227 372/45.01
8,270,446 B2 9/2012 Shiota et al.
2003/0194827 A1 * 10/2003 Lentz .................... H10F 71/127 257/E31.059
2007/0153858 A1 * 7/2007 Kim ................... G02B 6/12004 372/50.1
2011/0159620 A1 * 6/2011 Katsuyama ........... H01S 5/2275 257/E33.024
2018/0375290 A1 * 12/2018 Miyasaka ............. B82Y 20/00

FOREIGN PATENT DOCUMENTS

JP 09214045 H 8/1997

* cited by examiner

*Primary Examiner* — Minsun O Harvey
*Assistant Examiner* — Fernanda Adriana Camacho Alanis
(74) *Attorney, Agent, or Firm* — Secant IP, P.L.L.C.

(57) ABSTRACT

A semiconductor optical device including a buried heterostructure (BH) has reduced parasitic capacitance and reduced inter-diffusion. The semiconductor optical device is manufactured by a regrowth on both sides of a mesa structure with an Fe-doped current blocking layer and an n-type cladding layer outside of an active region in the mesa structure. The Fe-doped current blocking layer and the n-type cladding layer may be disposed and configured such that Fe/Zn inter-diffusion is reduced or prevented by minimal contact between the Fe-doped current blocking layer and a highly Zn-doped cladding layer and by the n-type cladding layer, as will be described in greater detail below. A low Zn-doped or undoped material may be used for a thin cladding layer above the active region in the mesa structure to further suppress Zn/Fe inter-diffusion.

18 Claims, 8 Drawing Sheets

(BACKGROUND INFORMATION)

(BACKGROUND INFORMATION)

(BACKGROUND INFORMATION)

InGaAs:Zn
InP: Ru
InGaP graded: Ru
InGaP : Ru
InP Substrate
InP: Zn
100c
n-InP (BACKGROUND INFORMATION)

SEMICONDUCTOR OPTICAL DEVICE WITH A BURIED HETEROSTRUCTURE (BH) HAVING REDUCED PARASITIC CAPACITANCE AND REDUCED INTER-DIFFUSION

TECHNICAL FIELD

The present disclosure relates to semiconductor optical devices for optical communications and data centers, and more particularly, to semiconductor optical devices having a buried heterostructure (BH) with reduced parasitic capacitance and reduced inter-diffusion.

BACKGROUND INFORMATION

Growing interest in integrated optical communications and data processing applications drives the development of ultra-small and energy efficient on-chip photonic components. Semiconductor optical devices, such as lasers and optical modulators, are used as a light source for such communications.

An optical communication semiconductor laser may include a ridge waveguide (RWG) structure or a buried heterostructure (BH). In RWG structure lasers, a thickness variation of the upper cladding layer provides optical confinement. This type of structure is simpler and easier to fabricate, but the RWG structure does not laterally confine carriers in the active region, leading to transverse carrier spreading at high temperatures.

In existing BH lasers, the buried heterostructure is formed by regrowth of current blocking layers (made of materials of higher resistance than the active region) on the side walls, which prevent transverse carrier spreading. With proper choice of material, the blocking layers can also have a lower thermal impedance than the active region, aiding heat dissipation out of the active region. Improved transverse carrier confinement and heat dissipation make BH lasers ideal for certain applications, such as uncooled and low chirp directly modulated lasers. Controlling parasitic capacitance and inter-diffusion in existing BH lasers, however, has been a challenge.

FIGS. 1A-1D illustrate the schematic cross sections of examples of known BH lasers. In the PN BH laser 100*a* shown in FIG. 1A, the parasitic capacitance of the current blocking layer formed by the PN buried structure is much larger than that of the current blocking layer formed by the semi-insulating layer. As a result, it is difficult to realize high speed operation for devices with this PN buried structure.

In the InP:Fe BH laser 100*b* shown in FIG. 1B, adding Fe to the insulating layer reduces parasitic capacitance but resulting Zn/Fe inter-diffusion reduces the performance. In particular, Zn diffusion into the high-insulating buried Fe-doped InP layer damages the insulating property, and as a result, increases current leakage and junction capacitance. Also, Fe diffusion into the p-type cladding layer decreases conductivity, and Fe diffusion into the MQW active region degrades the performance and reliability. Attempting to suppress the Fe/Zn inter-diffusion by decreasing Fe doping, however, results in insufficient current blocking effect and causes a current leakage issue.

As shown in the BH laser 100*c* in FIG. 1C, an n-type InP layer (e.g., Si-doped InP) may be inserted as an Fe diffusion preventing layer. The low resistivity of the n-type layer between the cladding layer and the burying layer, however, increases the current leakage. In the case of an optical modulator, this thin n-type layer also introduces additional capacitance which limits high speed operation.

As shown in the BH laser 100*d* in FIG. 1D, the Fe doped InP layer may be replaced with an Ru doped InP layer for semi-insulating due to low Ru—Zn inter diffusion. Because the Ru doped InP layer does not have a sufficiently large band gap with respect to the active region and the InP cladding, however, the current leakage is not suppressed and a wide gap material InGaP is used to suppress the current leakage. Because InGaP is not lattice matched to the InP, the incorporation ratio of In/Ga could change with etching and regrowth, which could cause a mismatch and defects.

Thus, designing a buried heterostructure in a semiconductor optical device, such as a laser, that both reduces parasitic capacitance and reduces inter-diffusion presents a number of non-trivial challenges.

SUMMARY

Consistent with an aspect of the present disclosure, a semiconductor optical device includes a semiconductor substrate and a buried mesa structure formed on the semiconductor substrate. The buried mesa structure includes a first n-type cladding layer, an active region above the first n-type cladding layer, and a first p-type cladding layer above the active region. Stacked side layers are disposed on each side of the buried mesa structure, and the stacked side layers include an Fe-doped current blocking layer burying the buried mesa structure on each side and a second n-type cladding layer on the Fe-doped current blocking layer. A second p-type cladding layer is disposed above the mesa structure and the stacked side layers. The second p-type cladding layer is a highly Zn-doped layer, and contact portions of the Fe-doped current blocking layer extend above the active region to contact the highly Zn-doped layer. The second n-type cladding layer is outside the contact portions of the Fe-doped current blocking layer and between a substantial portion of the Fe-doped current blocking layer and the highly Zn-doped layer.

Consistent with another aspect of the present disclosure, semiconductor laser includes a semiconductor substrate and a buried mesa structure formed on the semiconductor substrate. The buried mesa structure includes a first n-type InP cladding layer, an active region above the first n-type InP cladding layer, a grating disposed within the first n-type InP cladding layer below the active region, and a first p-type InP cladding layer above the active region. Stacked side layers are disposed on each side of the buried mesa structure and include an Fe-doped InP layer burying the buried mesa structure on each side and a second n-type InP cladding layer on the Fe-doped InP layer. A second p-type InP cladding layer is disposed above the mesa structure and the stacked side layers. The second p-type cladding layer is a highly Zn-doped InP layer, and contact portions of the Fe-doped InP layer extend above the active region to contact the highly Zn-doped InP layer. The second n-type InP cladding layer is outside the contact portions of the Fe-doped InP layer and between a substantial portion of the Fe-doped InP layer and the highly Zn-doped InP layer. A third p-type cladding layer is disposed on the second p-type cladding layer, wherein the third p-type cladding layer is a Zn-doped InGaAs layer.

Consistent with a further aspect of the present disclosure, a semiconductor optical modulator includes a semiconductor substrate and a buried mesa structure formed on the semiconductor substrate. The buried mesa structure includes a first n-type InP cladding layer, an active region above the first n-type InP cladding layer, and a first p-type InP cladding layer above the active region. Stacked side layers are disposed on each side of the buried mesa structure and include an Fe-doped InP layer burying the buried mesa structure on each side and a second n-type InP cladding layer on the Fe-doped InP layer. A second p-type InP cladding layer is disposed above the mesa structure and the stacked side layers. The second p-type InP cladding layer is a highly Zn-doped InP layer, and contact portions of the Fe-doped InP layer extend above the active region to contact the highly Zn-doped InP layer. The second n-type InP cladding layer is outside the contact portions of the Fe-doped InP layer and between a substantial portion of the Fe-doped InP layer and the highly Zn-doped InP layer. A third p-type cladding layer is disposed on the second p-type cladding layer, wherein the third p-type cladding layer is a Zn-doped InGaAs layer. A top mesa structure is formed by at least the p-type cladding layers and the second n-type cladding layer. An n-type metal layer is disposed on the bottom under the substrate and a p-type metal layer is disposed on the top and located in a contact window formed on the top mesa structure.

BRIEF DESCRIPTION OF THE DRAWINGS

These and other features and advantages will be better understood by reading the following detailed description, taken together with the drawings wherein.

DETAILED DESCRIPTION

A semiconductor optical device including a buried heterostructure (BH), consistent with embodiments of the present disclosure, has reduced parasitic capacitance and reduced inter-diffusion. The semiconductor optical device is manufactured by a regrowth on both sides of a mesa structure with an Fe-doped current blocking layer and an n-type cladding layer outside of an active region in the mesa structure. The Fe-doped current blocking layer and the n-type cladding layer may be disposed and configured such that Fe/Zn inter-diffusion is reduced or prevented by minimal contact between the Fe-doped current blocking layer and a highly Zn-doped cladding layer and by the n-type cladding layer, as will be described in greater detail below. A low Zn-doped or undoped material may be used for a thin cladding layer above the active region in the mesa structure to further suppress Zn/Fe inter-diffusion.

The semiconductor optical device, consistent with embodiments of the present disclosure, may include a semiconductor laser or an optical modulator. Such optical devices may be used, for example, in optical transceivers in optical communications systems and/or data centers. A transmitter optical subassembly (TOSA) in an optical transceiver (e.g., a 10G transceiver), for example, may includer an electro-absorption modulated laser (EML) fabricated using the buried heterostructure configuration described herein.

As used herein, "highly Zn-doped" refers to a higher concentration of Zn in a range of about $5\times10^{17}$ $cm^{-3}$ to $3\times10^{18}$ $cm^{-3}$ and "low Zn-doped" refers to a lower concentration of Zn in a range of about $1\times10^{16}$ $cm^{-3}$ to $5\times10^{17}$ $cm^{-3}$. As used herein, "semi-insulating" refers to a high resistivity of a semiconductor in the range of about $10^6$ to $10^9\Omega\cdot cm$.

Figures 1A, 1B:
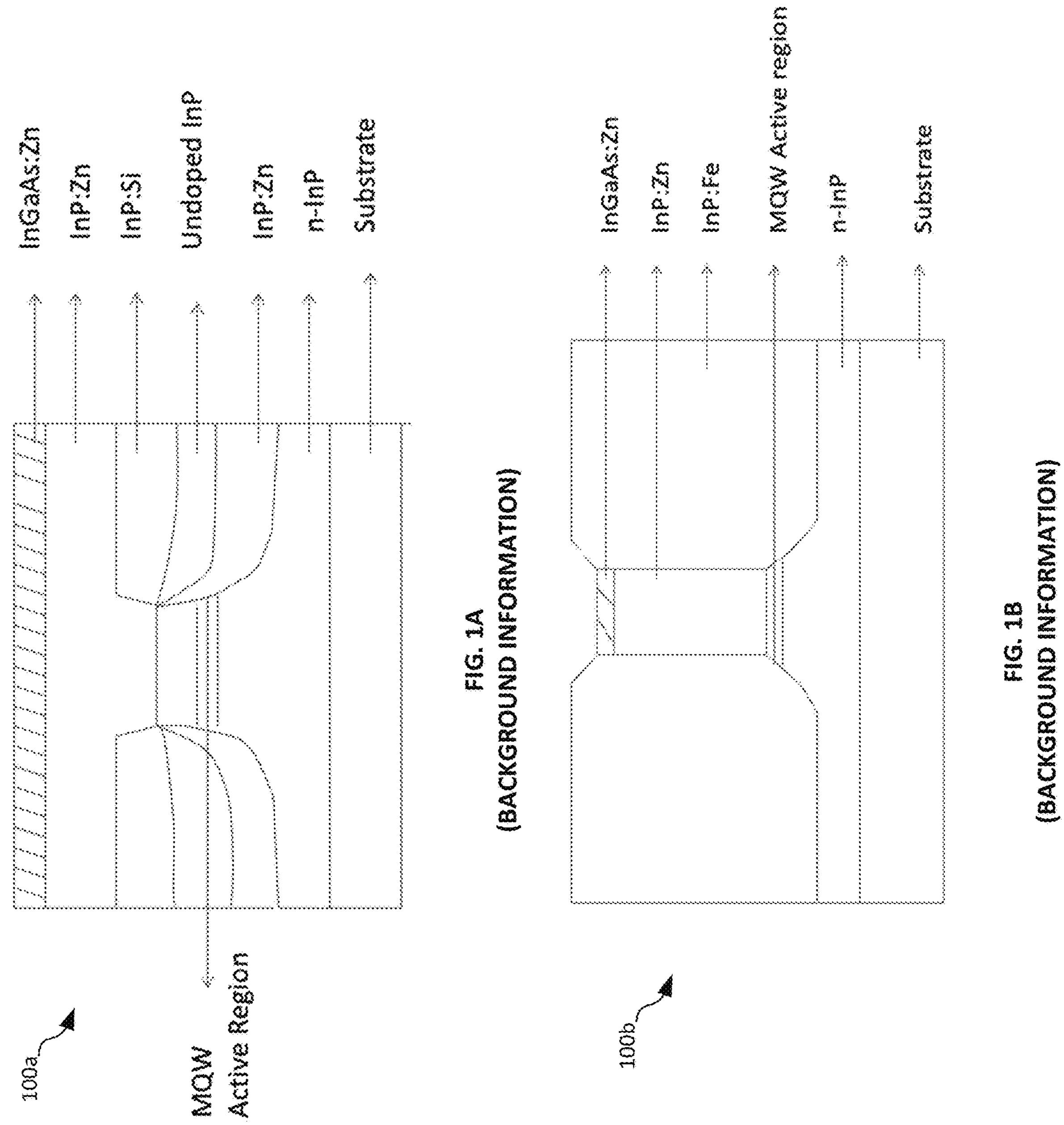
FIG. 1A is a schematic cross-sectional view of a known PN buried heterostructure (BH) laser.
FIG. 1B is a schematic cross-sectional view of a known InP:Fe BH laser.
Figures 1C, 1D:
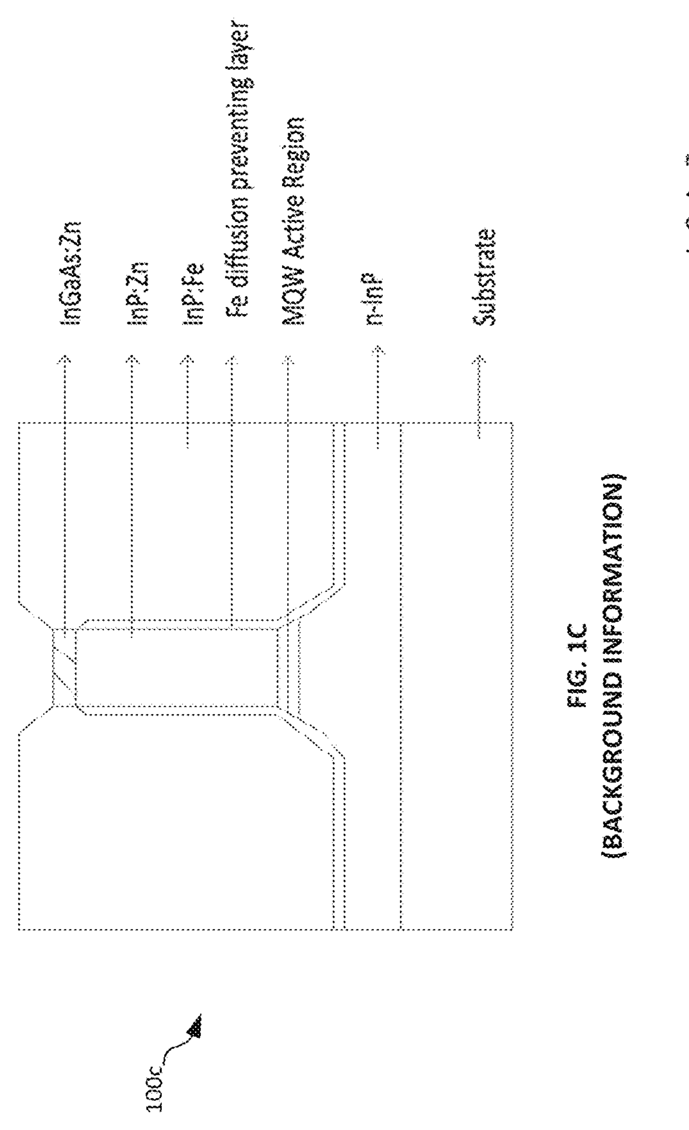
FIG. 1C is a schematic cross-sectional view of a known InP:Fe BH laser with an Fe diffusion preventing layer.
FIG. 1D is a schematic cross-sectional view of a known BH laser with Ru-doped InP replacing Fe-doped InP.
Figure 2:
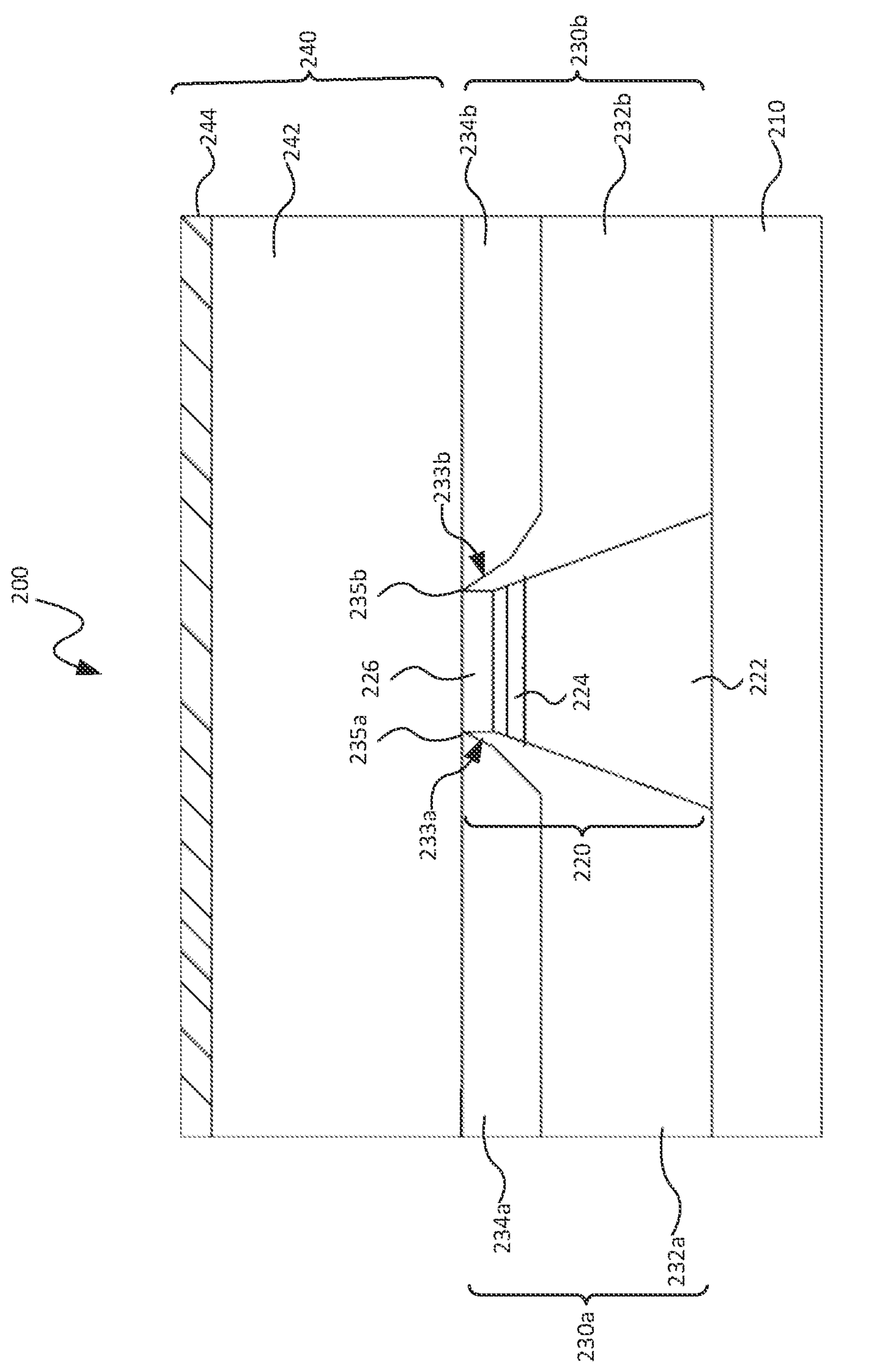
FIG. 2 is a schematic cross-sectional view of a semiconductor optical device including an example buried heterostructure, in accordance with embodiments of the present disclosure.

One embodiment of a semiconductor optical device 200 with a buried heterostructure is shown in FIG. 2. In the illustrated embodiment, the semiconductor optical device 200 includes semiconductor substrate 210, a buried mesa structure 220, stacked side layers 230*a*, 230*b* on each side of the buried mesa structure 220, and stacked top cladding layers 240. The stacked side layers 230*a*, 230*b* include the Fe-doped current blocking layer 232*a*, 232*b* and the n-type cladding layer 234*a*, 234*b* that reduces or prevents Zn—Fe inter-diffusion, as will be described in greater detail below. The stacked top cladding layer 240 includes at least the highly Zn-doped cladding layer 242. The Fe-doped current blocking layer 232*a*, 232*b* is also semi-insulating.

In the illustrated embodiment, the buried mesa structure 220 includes a first n-type cladding layer 222, an active region 224 above the first n-type cladding layer 222, and a first p-type cladding layer 226 above the active region 224. The buried mesa structure 220 is provided on the semiconductor substrate 210 and formed like a mesa stripe. The first n-type cladding layer 222 may include an n-type doped InP layer and the first p-type cladding layer 226 may include a p-type doped InP layer, such as low Zn doped InP or undoped InP. The active region 224 may include a multiple quantum well (MQW) active region. In one embodiment, the buried mesa structure 220 may be formed as trapezoid shape with a bottom width of the first n-type cladding layer 222 larger than that of the active region 224.

Lateral sides of the buried mesa structure 220 are buried by stacked side layers 230*a*, 230*b* including the Fe-doped current blocking layer 232*a*, 232*b* and the second n-type cladding layer 234*a*, 234*b*. The Fe-doped current blocking layer 232*a*, 232*b* on each side is disposed on the substrate 210 and the second n-type cladding layer 234*a*, 234*b* is disposed on the Fe-doped current blocking layer 232*a*, 232*b*. The Fe-doped current blocking layer 232*a*, 232*b* extends along each side of the first n-type cladding layer 222 with contact portions 233*a*, 233*b* extending above the active region 224 to contact the highly Zn-doped cladding layer 242. The second n-type cladding layer 234*a*, 234*b* may include an n-type doped InP layer, such as Si-doped InP, and is disposed on each side of the contact portions 233*a*, 233*b* of the Fe-doped current blocking layer 232*a*, 232*b* and between the Fe-doped current blocking layer 232*a*, 232*b* and the highly Zn-doped cladding layer 242 to prevent Zn/Fe inter-diffusion. Thus, both the first n-type cladding layer 222 and the second n-type cladding layer 234*a*, 234*b* surround a substantial portion of the Fe-doped current blocking layer 232*a*, 232*b* to prevent Zn/Fe inter-diffusion.

In the illustrated embodiment, the contact portions 233*a*, 233*b* are tapered to a tip that contacts the highly Zn-doped cladding layer 242. The first p-type cladding layer 226 and the second n-type cladding layer 234*a*, 234*b* are disposed on each side of the contact portions 233*a*, 233*b*, thereby providing minimal contact between the Fe-doped current blocking layer 232*a*, 232*b* and the highly Zn-doped cladding layer 242. The tip of the contact portions 233*a*, 233*b* may be pointed, as shown in FIG. 2, or flat as shown in the embodiments described below. In one embodiment, the contact portions 233*a*, 233*b* contact the highly Zn-doped cladding layer 242 at contact regions 235*a*, 235*b* that are less than about 5% of the total surface area of the highly Zn-doped cladding layer 242.

In the illustrated embodiment, the stacked top cladding layer 240 includes at least a second Zn-doped cladding layer 244, which may be Zn-doped InGaAs. The first highly Zn-doped cladding layer 242 may be Zn-doped InP.

In one example, the Fe-doped current blocking layer 232*a*, 232*b* may have a thickness of about 1.2 to 6 μm, the second n-type cladding layer 234*a*, 234*b* may have a thickness of about 0.1 to 0.6 μm, the first n-type cladding layer 222 may have a thickness of about 0.1 to 1.5 μm, the active region 224 may have a thickness of about 0.1 to 0.6 μm, the first p-type cladding layer 226 may have a thickness of about 0.05 to 0.3 μm, the highly Zn-doped cladding layer 242 may have a thickness of about 1.5 to 2.5 μm, and the second Zn-doped cladding layer 244 may have a thickness of about 0.05 to 0.3 μm.

One challenge with existing semiconductor optical devices including a buried heterostructure is reducing parasitic capacitance without increasing Fe/Zn inter-diffusion, especially with new semiconductor optical devices that are designed to provide high-speed operation. Prior attempts at reducing the Fe/Zn inter-diffusion, resulted in increasing current leakage or/and introducing additional capacitance. In contrast, the semiconductor optical device with a buried heterostructure, consistent with embodiments described herein, is capable of reduced parasitic capacitance while also suppressing the Fe/Zn inter-diffusion by minimizing the contact area between the Zn-doped cladding layer 242 and the Fe-doped current blocking layer 232*a*, 232*b*. Using a low Zn-doped or undoped thin cladding layer 226 above the active region 224 further suppresses the Fe/Zn inter-diffusion. Thus, the highly Zn-doped cladding layer 242 mostly contacts the second n-type cladding layer 234*a*, 234*b* and the low Zn-doped or undoped cladding layer 226.

BH Laser Diode

Figure 3:
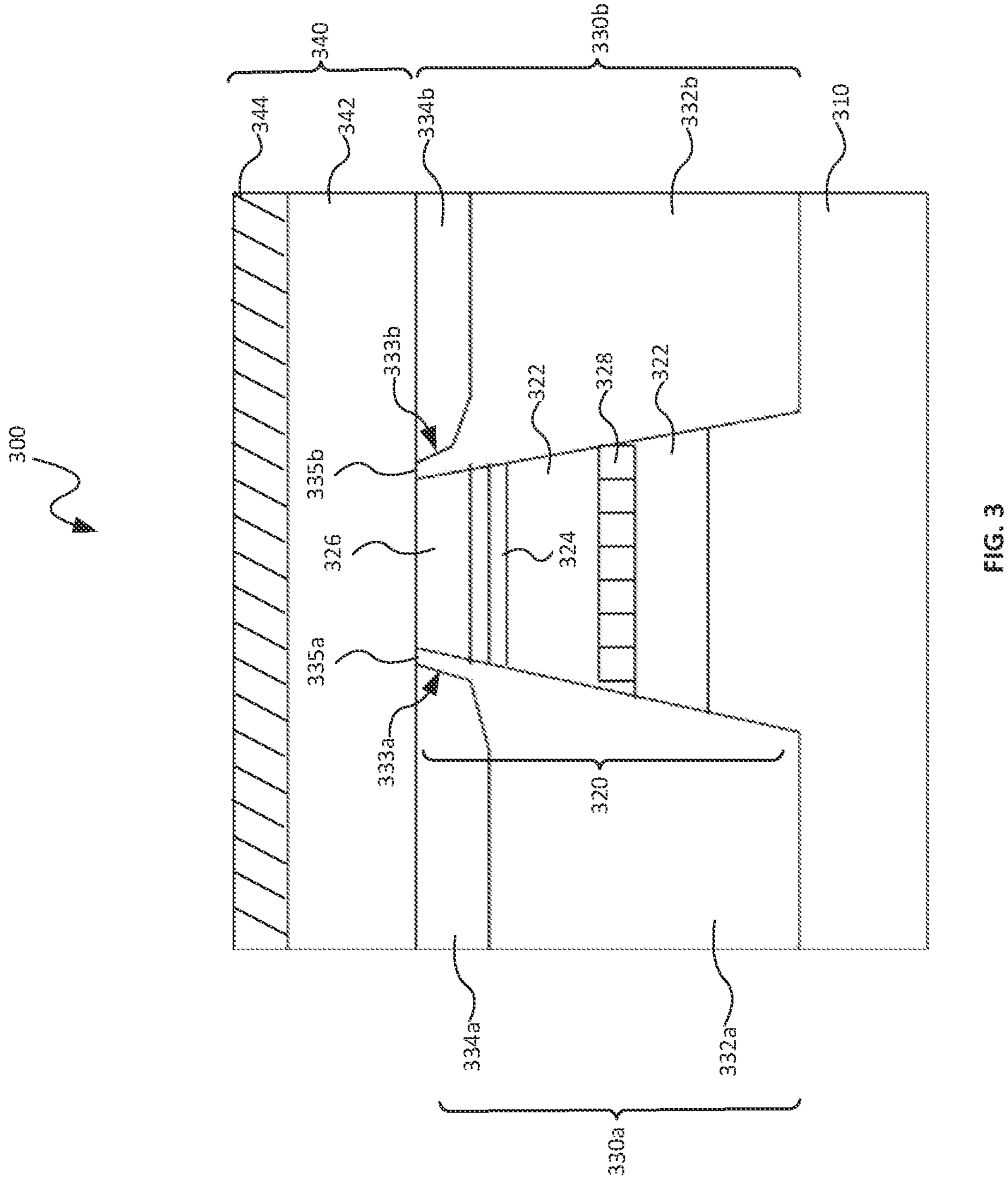
FIG. 3 is a schematic cross-sectional view of a semiconductor laser including an example buried heterostructure, in accordance with embodiments of the present disclosure.

Referring to FIG. 3, a semiconductor laser 300 may be fabricated with the buried heterostructure configuration described above. The semiconductor laser 300 may be used, for example, as a directly modulated laser (DML) or in an electro-absorption modulated laser (EML). In one example, the semiconductor laser 300 is a 1577 nm laser used in a 10G EML product.

An embodiment of the semiconductor laser 300 includes a substrate 310, a buried mesa structure 320 formed on the substrate 310, stacked side layers 320*a*, 320*b* burying the mesa structure 320 on each side, and stacked top cladding layers 340. The mesa structure 320 includes a grating 328 disposed between first n-type InP cladding layers 322, an MQW active region 324 above the first n-type InP cladding layer 322, and a low Zn-doped or undoped InP cladding layer 326 above the MQW active region 324. The stacked side layers 320*a*, 320*b* include an Fe-doped InP layer 332*a*, 332*b* and a second n-type InP cladding layer 334*a*, 334*b*, such as a Si-doped InP layer, arranged similar to the embodiment described above in connection with FIG. 2. The top cladding layers 340 include a highly Zn-doped InP cladding layer 342 and a Zn-doped InGaAs cladding layer 344.

Similar to the embodiment described above, the Fe-doped InP layer 332*a*, 332*b* has contact portions 333*a*, 333*b* extending above the MQW active region 324, and the low Zn-doped or undoped InP cladding layer 326 and the second n-type cladding layer 334*a*, 334*b* are disposed on each side of the contact portions 333*a*, 333*b* to suppress Fe/Zn inter-diffusion. In this embodiment, the contact portions 333*a*, 333*b* have a flattened top but the contact regions 335*a*, 335*b* are still sufficiently small (e.g., less than about 5% of the surface area of the highly Zn-doped InP cladding layer 342) to reduce the Fe/Zn inter-diffusion. Although this embodiment of the semiconductor laser 300 is described with InP layers, other semiconductor materials may also be used.

The grating 328 may be used to provide frequency selectivity of a single axial mode in the laser. One example of a grating 328 includes corrugations with a periodic structure having a period chosen as half of the average optical wavelength, which leads to a constructive interference between the reflected beams. A laser with the grating as a cavity reflector may provide a single longitudinal mode.

According to one method of fabrication of the semiconductor laser 300, the layers forming the buried mesa structure 320 (i.e., the n-type InP layers 322, the grating 328, the MQW active region 324, and the low Zn-doped or undoped InP layer 326) may be first deposited on the substrate 310. These layers may then be etched to form the mesa structure 320, for example, using lithographic patterning with a mask. The stacked side layers 330*a*, 330*b* may then be deposited by regrowth on both sides of the mesa structure 320 and then the top cladding layers 340 may be deposited by regrowth. The layers may be grown, for example, by molecular beam epitaxy (MBE) after in situ surface cleaning.

Figure 4A:
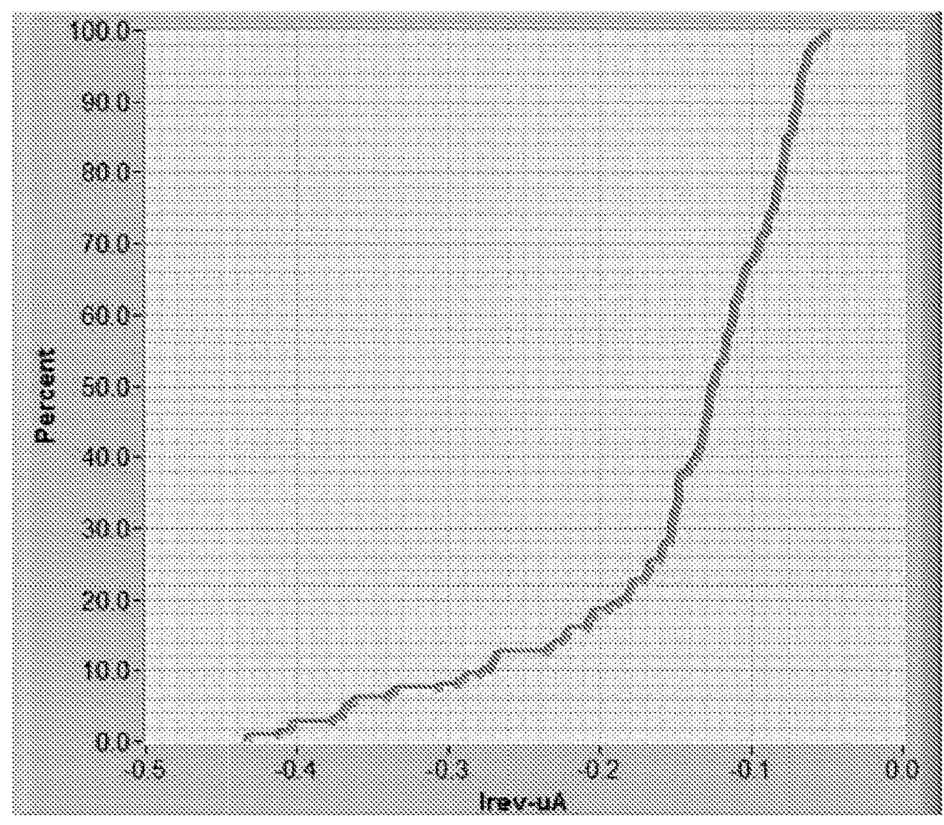
FIG. 4A is a graph illustrating a reverse leakage curve of an example 1577 nm wavelength uncoated laser fabricated with a buried heterostructure, in accordance with aspects of the present disclosure.

FIGS. 4A-4D illustrate the performance of an example 1577 nm uncoated (300 μm cavity) semiconductor laser including the BH structure and fabricated as described above. FIG. 4A shows that the reverse current leakage of the 1577 nm wavelength uncoated laser is within a sub pA range when a reverse bias of 2V is applied, thus indicating that the current leakage has been suppressed.

Figure 4B:
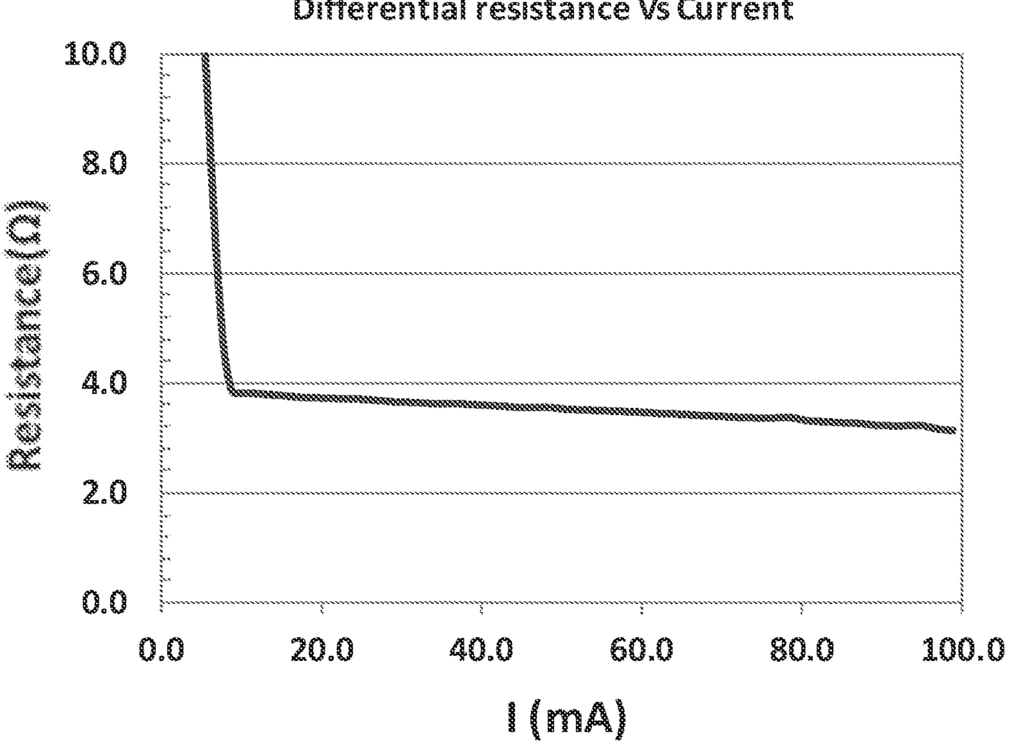
FIG. 4B is a graph illustrating laser resistance v. current of the example 1577 nm wavelength uncoated laser fabricated with the buried heterostructure.

FIG. 4B shows the laser resistance (ohms) v. current (mA) of the example 1577 nm wavelength uncoated laser. As shown, low laser resistance (e.g., around 4 ohms) may be achieved, which indicates that the thin low Zn-doped InP cladding layer has minimal effect on laser resistance. The laser resistance v. current curve is also relatively flat, indicating a low forward current leakage.

Figure 4C:
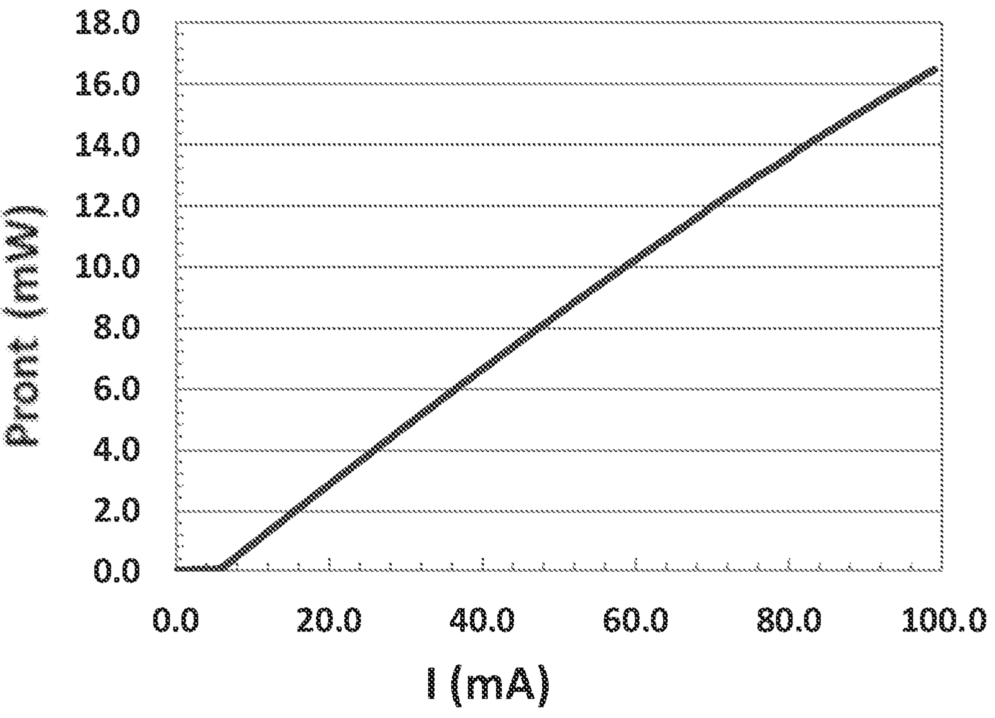
FIG. 4C is a graph illustrating optical power per facet v. current of the example 1577 nm wavelength uncoated laser fabricated with the buried heterostructure.

FIG. 4C shows good optical power per facet v. current of the example 1577 nm wavelength uncoated laser, which indicates no degradation due to Fe/Zn inter-diffusion.

Figure 4D:
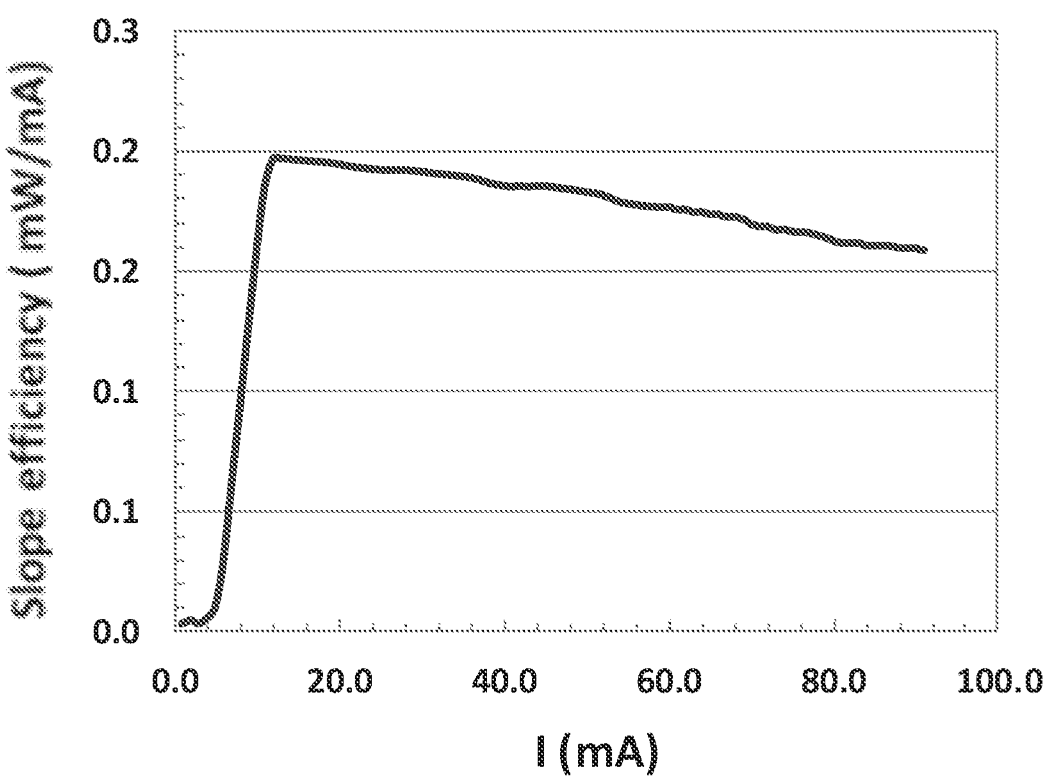
FIG. 4D is a graph illustrating slope efficiency per facet v. current of the example 1577 nm wavelength uncoated laser made with the buried heterostructure.

FIG. 4D shows good slope efficiency (mW/mA) per facet v. current of the example 1577 nm wavelength uncoated laser. Overall, these graphs illustrate that high performance and high reliability may be achieved with a semiconductor laser including a BH structure designed to suppress Zn/Fe inter-diffusion while still reducing parasitic capacitance, according to the embodiments described above.

BH Optical Modulator

Figures 5A, 5B:
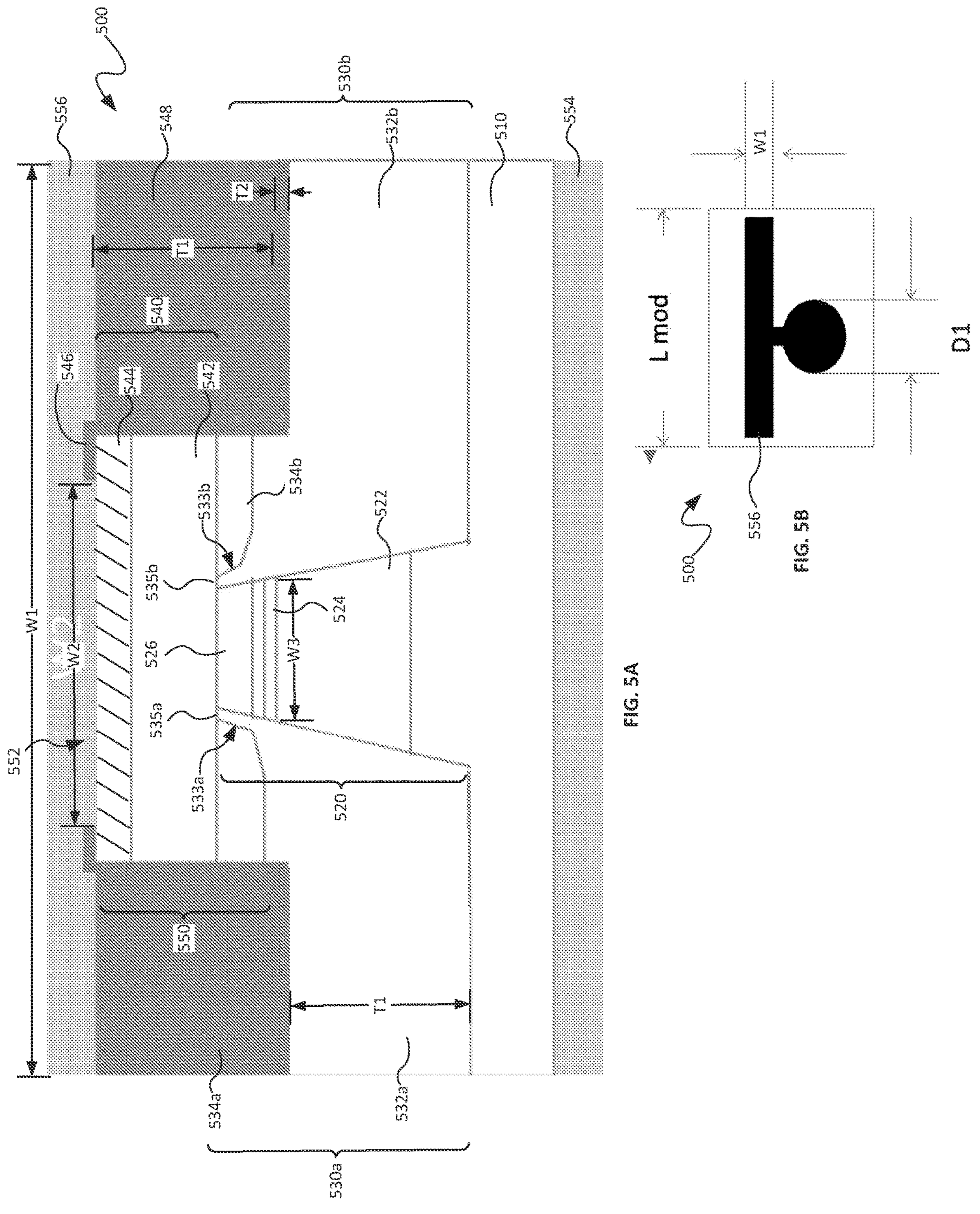
FIG. 5A is a schematic cross-sectional view of a semiconductor optical modulator including an example buried heterostructure, consistent with further embodiments of the present disclosure.
FIG. 5B is a top view of the semiconductor optical modulator of FIG. 5A.

Referring to FIGS. 5A and 5B, an optical modulator 500 may be fabricated with the buried heterostructure configuration described herein. An optical modulator is an optical device used to modulate a beam of light with a perturbation device. An optical modulator may convert information to modulated optical signals, which may be transmitted through an optical fiber, an optical waveguide or another transmission medium in fiber optic communication. The optical modulator 500 may be used, for example, to provide modulation in an EML.

An embodiment of the optical modulator 500 includes a substrate 510, a buried mesa structure 520 formed on the substrate 510, stacked side layers 520*a*, 520*b* burying the mesa structure 510 on each side, and stacked top cladding layers 540. The mesa structure includes a first n-type InP cladding layers 522, an MQW active region 524 above the first n-type InP cladding layer 522, and a low Zn-doped or undoped InP cladding layer 526 above the MQW active region 524. The stacked side layers 520*a*, 520*b* include an Fe-doped InP layer 532*a*, 532*b* and a second n-type InP cladding layer 534*a*, 534*b*, such as a Si-doped InP layer, arranged similar to the embodiment described above in connection with FIG. 2. The top cladding layers 540 include a highly Zn-doped InP cladding layer 542 and a Zn-doped InGaAs cladding layer 544.

Similar to the embodiment described above, the Fe-doped InP layer 532*a*, 532*b* has contact portions 533*a*, 533*b* extending above the MQW active region 524, and the low Zn-doped or undoped InP cladding layer 526 and second n-type cladding layer 534*a*, 534*b* are disposed on each side of the contact portions 533*a*, 533*b* to suppress Fe/Zn inter-diffusion. In this embodiment, the contact portions 533*a*, 533*b* have a flattened top but the contact regions 535*a*, 535*b* are still sufficiently small (e.g., less than about 5% of the surface area of the highly Zn-doped InP cladding layer 542) to reduce the Fe/Zn inter-diffusion. Although this embodiment of the optical modulator 500 is described with InP layers, other semiconductor materials may also be used.

In the optical modulator 500 embodiment, the upper layers, e.g., the top cladding layers 540, the second n-type cladding layer 534*a*, 534*b*, and a portion of the Fe-doped InP layer 532*a*, 532*b*, are formed as a second or top mesa structure 550. A silicon dioxide layer 546 is provided over a portion of the top of the second mesa structure 550, the sides of the second mesa structure 550, and a top portion of the Fe-doped InP layer 532*a*, 532*b*. The silicon dioxide layer 546 forms an exposed portion 552 on the top of the second mesa structure 550 where the Zn-doped InGaAs cladding layer 544 is exposed to create a contact window for providing electrical contact. A benzocyclobutene (BCB) polymer layer 548 is provided on the lateral sides of the second mesa structure 550 coated with the silicon dioxide layer 546. Other dielectric materials may also be used for the layers 546, 548. An n-type metal layer 554 is disposed on at least a portion of the bottom of the optical modulator 500 and a p-type metal layer 556 is disposed on at least a portion of the top of the optical modulator 500 including the exposed portion 552.

According to one method of fabrication of the optical modulator 500, the layers forming the buried mesa structure 520 (i.e., the n-type InP layer 522, the MQW active region 524, and the low Zn-doped or undoped InP layer 526) may be first deposited on the substrate 510. These layers may then be etched to form the mesa structure 520, for example, using lithographic patterning with a mask. The stacked side layers 530*a*, 530*b* may then be deposited by regrowth on both sides of the mesa structure 520 and then the top cladding layers 540 may be deposited by regrowth. The top cladding layer 540, the second n-type cladding layer 534*a*, 534*b*, and a portion of the Fe-doped InP layer 532*a*, 532*b* may then be etched to form the second or top mesa structure 550, for example, using lithographic patterning with a mask. The silicon dioxide layer 546 is then deposited and etched to form the contact window opening, and the BCB layer 548 is deposited and partially removed to expose the contact window.

Figure 6:
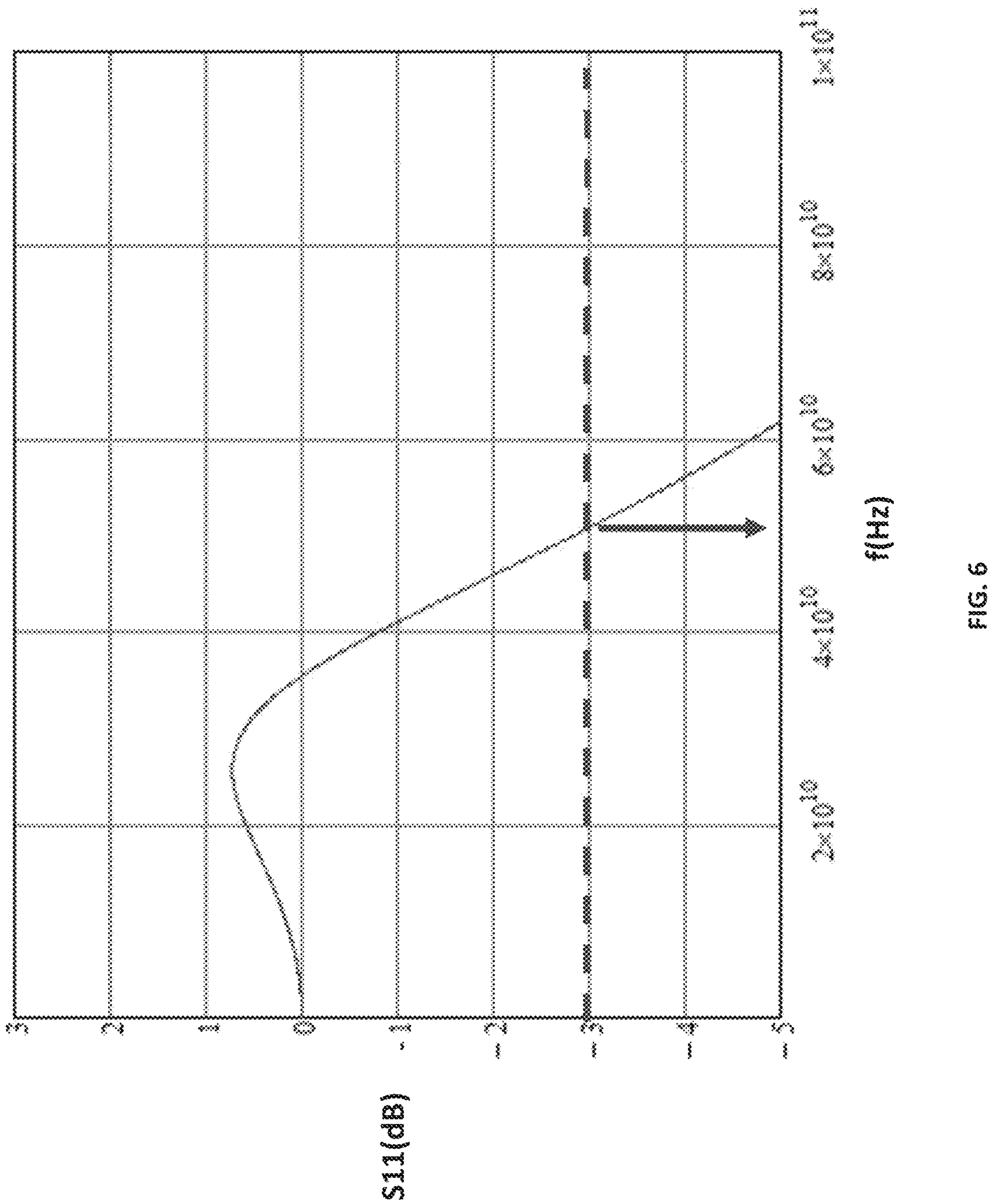
FIG. 6 is a graph illustrating an EO response simulation of one example of a semiconductor optical modulator fabricated with the buried heterostructure, in accordance with aspects of the present disclosure.

FIG. 6 illustrates an EO response simulation of one example of the optical modulator 500. In this example of the optical modulator 500, the modulator length L is 125 um, the modulator contact window width W1 is 11 μm, the second mesa structure width W2 is 7 μm, the bonding pad diameter D1 is 60 μm, the active region width W3 is 1.5 μm, the thickness of the BCB layer T1 is 2.3 μm, the thickness of the $SiO_2$ layer T2 is 0.2 μm, and the thickness of the InP:Fe layer T3 is 2.5 μm. As indicated by the arrow in FIG. 6, an EO 3 dB bandwidth of 50 GHz may be achieved, according to the illustrated simulation of the example optical modulator 500.

Accordingly, a buried heterostructure (BH), consistent with the present disclosure, may be used in either a semiconductor laser or an optical modulator with improved current leakage and capacitance and reduced inter-diffusion, thereby improving performance and reliability to meet the demands of high speed optical transceivers in optical communications and data centers.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A semiconductor optical device, comprising:

a semiconductor substrate;

a buried mesa structure formed on the semiconductor substrate, the buried mesa structure including a first n-type cladding layer, an active region above the first n-type cladding layer, and a first p-type cladding layer above the active region;

stacked side layers on each side of the buried mesa structure, the stacked side layers including an Fe-doped current blocking layer burying the buried mesa structure on each side and a second n-type cladding layer on the Fe-doped current blocking layer;

a second p-type cladding layer above the mesa structure and the stacked side layers, wherein the second p-type cladding layer is a highly Zn-doped layer including a concentration of Zn in a range of $5\times10^{17}$ $cm^{-3}$ to $3\times10^{18}$ $cm^{-3}$, wherein contact portions of the Fe-doped current blocking layer extend above the active region to contact the highly Zn-doped layer, and wherein the second n-type cladding layer is outside the contact portions of the Fe-doped current blocking layer and between a substantial portion of the Fe-doped current blocking layer and the highly Zn-doped layer, wherein tops of the first p-type cladding layer, the second n-type cladding layer, and the contact portions of the Fe-doped current blocking layer are flush with one another and at the same level, and wherein the contact portions of the Fe-doped current blocking layer contact the highly Zn-doped layer at a contact region that is less than 5% of the total surface area of the highly Zn-doped layer.

2. The semiconductor optical device of claim 1, wherein the contact portions of the Fe-doped current blocking layer taper to a tip that contacts the highly Zn-doped layer.

3. The semiconductor optical device of claim 1, wherein the first n-type cladding layer, the second n-type cladding layer, the first p-type cladding layer, and the second p-type cladding layer, and the Fe-doped current blocking layer are InP layers.

4. The semiconductor optical device of claim 3, wherein the first p-type cladding layer is a low Zn-doped InP layer including a concentration of Zn in a range of $1'10^{16}$ $cm^{-3}$ to $5\times10^{17}$ $cm^{-3}$.

5. The semiconductor optical device of claim 3, wherein the first p-type cladding layer is a Zn-undoped InP layer.

6. The semiconductor optical device of claim 3, wherein the second n-type cladding layer is an Si-doped InP layer.

7. The semiconductor optical device of claim 1, further including a third p-type cladding layer on the second p-type cladding layer, wherein the third p-type cladding layer is a Zn-doped cladding layer.

8. The semiconductor optical device of claim 7, wherein the third p-type cladding layer is a Zn-doped InGaAs layer.

9. The semiconductor optical device of claim 1, wherein the active region is a multiple quantum well (MQW) active region.

10. The semiconductor optical device of claim 9, further comprising a grating disposed within the first n-type cladding layer below the MQW active region.

11. The semiconductor optical device of claim 1, further comprising an n-type metal layer on the bottom under the substrate and a p-type metal layer on the top.

12. The semiconductor optical device of claim 11, wherein a top mesa structure is formed by at least the first and second p-type cladding layers and the second n-type cladding layer, and wherein the p-type metal layer is located in a contact window formed on the top mesa structure.

13. A semiconductor laser including the semiconductor optical device of claim 1, wherein the first n-type cladding layer, the second n-type cladding layer, the first p-type cladding layer, and the second p-type cladding layer, and the Fe-doped current blocking layer are InP layers, wherein the buried mesa structure includes a grating disposed within the first n-type InP cladding layer below the active region, and further comprising:

a third p-type cladding layer on the second p-type cladding layer, wherein the third p-type cladding layer is a Zn-doped InGaAs layer.

14. The semiconductor laser of claim 13, wherein the active region is a multiple quantum well (MQW) active region.

15. The semiconductor laser of claim 13, wherein the first p-type cladding layer is a low Zn-doped InP layer including a concentration of Zn in a range of $1\times10^{16}$ $cm^{-3}$ to $5\times10^{17}$ $cm^{-3}$ or an undoped InP layer.

16. A semiconductor optical modulator including the semiconductor optical device of claim 1, wherein the first n-type cladding layer, the second n-type cladding layer, the first p-type cladding layer, and the second p-type cladding layer, and the Fe-doped current blocking layer are InP layers, and further comprising:

a third p-type cladding layer on the second p-type cladding layer, wherein the third p-type cladding layer is a Zn-doped InGaAs layer;

wherein a top mesa structure is formed by at least the first and second p-type cladding layers and the second n-type cladding layer; and an n-type metal layer on the bottom under the substrate and a p-type metal layer on the top and located in a contact window formed on the top mesa structure.

17. The semiconductor optical modulator of claim 16, wherein the active region is a multiple quantum well (MQW) active region.

18. The semiconductor optical modulator of claim 16, wherein the first p-type InP cladding layer is a low Zn-doped InP layer including a concentration of Zn in a range of $1\times10^{16}$ $cm^{-3}$ to $5\times10^{17}$ $cm^{-3}$ or an undoped InP layer.

* * * * *